US012590232B2

(12) United States Patent
Park et al.

(10) Patent No.: US 12,590,232 B2
(45) Date of Patent: Mar. 31, 2026

(54) MULTI-REGION FOLDABLE ADHESIVE FILM AND FABRICATION METHOD THEREFOR

(71) Applicant: LG CHEM, LTD., Seoul (KR)

(72) Inventors: Byung Su Park, Daejeon (KR); Hyun Cheol Kim, Daejeon (KR); Hyon Gyu Park, Daejeon (KR)

(73) Assignee: Xinmei Fontana Holding (Hong Kong) Limited, Hong Kong (CN)

( * ) Notice: Subject to any disclaimer, the term of this patent is extended or adjusted under 35 U.S.C. 154(b) by 506 days.

(21) Appl. No.: 17/639,109

(22) PCT Filed: Oct. 12, 2020

(86) PCT No.: PCT/KR2020/018090
§ 371 (c)(1),
(2) Date: Feb. 28, 2022

(87) PCT Pub. No.: WO2021/118275
PCT Pub. Date: Jun. 17, 2021

(65) Prior Publication Data
US 2022/0332989 A1 Oct. 20, 2022

(30) Foreign Application Priority Data
Dec. 10, 2019 (KR) ........................ 10-2019-0164158
Dec. 13, 2019 (KR) ........................ 10-2019-0167239

(51) Int. Cl.
*C09J 133/10* (2006.01)
*B32B 5/14* (2006.01)
(Continued)

(52) U.S. Cl.
CPC ............. *C09J 133/10* (2013.01); *B32B 5/142* (2013.01); *B32B 5/147* (2013.01); *B32B 7/12* (2013.01);
(Continued)

(58) Field of Classification Search
CPC .. C09J 133/00–133/26; C09J 5/00–5/10; C09J 7/00–7/50
See application file for complete search history.

(56) References Cited

U.S. PATENT DOCUMENTS 9,359,528 B2 6/2016 Yoon et al.
9,637,665 B2 5/2017 Shim
(Continued)

FOREIGN PATENT DOCUMENTS

JP     2017-002116 A     1/2017
KR     10-0990673 B1     10/2010
(Continued)

OTHER PUBLICATIONS

Machine Translation of KR10-2019-0113633 (Year: 2019).*
(Continued)

*Primary Examiner* — Prashant J Khatri
(74) *Attorney, Agent, or Firm* — Ricky Lam

(57) ABSTRACT

The present invention relates to a multi-region foldable adhesive film and a fabrication method therefor, and particularly, to a multi-region foldable adhesive film having improved folding characteristics by making an adhesive layer included in the foldable adhesive film have different physical properties, and a fabrication method therefor.

9 Claims, 7 Drawing Sheets

(51) Int. Cl.

| | |
|---|---|
| *B32B 7/12* | (2006.01) |
| *C08F 220/18* | (2006.01) |
| *C09J 7/10* | (2018.01) |
| *C09J 7/20* | (2018.01) |
| *C09J 7/25* | (2018.01) |
| *C09J 7/38* | (2018.01) |
| *C09J 7/40* | (2018.01) |
| *C09J 11/00* | (2006.01) |
| *C09J 11/06* | (2006.01) |
| *C09J 133/08* | (2006.01) |
| *C09J 133/12* | (2006.01) |
| *G02F 1/1333* | (2006.01) |
| *G06F 1/16* | (2006.01) |
| *G09F 9/30* | (2006.01) |
| *H10K 77/10* | (2023.01) |
| *H10K 102/00* | (2023.01) |

(52) U.S. Cl.

CPC ...... *C08F 220/18* (2013.01); *C08F 220/1811* (2020.02); *C08F 220/1812* (2020.02); *C08F 220/1818* (2020.02); *C09J 7/10* (2018.01); *C09J 7/385* (2018.01); *C09J 133/08* (2013.01); *C09J 133/12* (2013.01); *B32B 2307/412* (2013.01); *B32B 2307/51* (2013.01); *B32B 2307/54* (2013.01); *B32B 2307/548* (2013.01); *B32B 2307/704* (2013.01); *B32B 2457/20* (2013.01); *C09J 7/20* (2018.01); *C09J 7/255* (2018.01); *C09J 7/403* (2018.01); *C09J 11/00* (2013.01); *C09J 11/06* (2013.01); *C09J 2203/318* (2013.01); *C09J 2203/326* (2013.01); *C09J 2301/124* (2020.08); *C09J 2301/208* (2020.08); *C09J 2301/21* (2020.08); *C09J 2301/302* (2020.08); *C09J 2301/312* (2020.08); *C09J 2301/408* (2020.08); *C09J 2301/414* (2020.08); *C09J 2301/416* (2020.08); *C09J 2433/00* (2013.01); *C09J 2467/006* (2013.01); *G02F 1/133305* (2013.01); *G02F 2202/28* (2013.01); *G06F 1/1652* (2013.01); *G09F 9/301* (2013.01); *H10K 77/111* (2023.02); *H10K 2102/311* (2023.02); *Y10T 428/24942* (2015.01); *Y10T 428/24983* (2015.01); *Y10T 428/2809* (2015.01); *Y10T 428/2891* (2015.01)

(56) References Cited

U.S. PATENT DOCUMENTS

| | | | | |
|---|---|---|---|---|
| 2014/0295150 A1* | 10/2014 | Bower | ................... | B32B 25/20 |
| | | | | 428/411.1 |
| 2015/0144913 A1* | 5/2015 | Shim | ......................... | C09J 5/00 |
| | | | | 264/496 |
| 2017/0166786 A1* | 6/2017 | Moon | ................... | C08F 265/06 |

FOREIGN PATENT DOCUMENTS

| | | | | |
|---|---|---|---|---|
| KR | 10-2011-0098692 A | | 9/2011 |
| KR | 10-2015-0061791 A | | 6/2015 |
| KR | 10-2017-0070370 A | | 6/2017 |
| KR | 10-2017-0078510 A | | 7/2017 |
| KR | 10-2017-0101339 A | | 9/2017 |
| KR | 10-2017-0115227 A | | 10/2017 |
| KR | 10-2018-0099541 A | | 9/2018 |
| KR | 10-2019-0074820 A | | 6/2019 |
| KR | 10-2019-0098435 A | | 8/2019 |
| KR | 10-2021449 B1 | | 9/2019 |
| KR | 10-2019-0113633 A | | 10/2019 |
| KR | 20190113633 A | * | 10/2019 |
| WO | 2018221109 A1 | | 12/2018 |
| WO | 2019190242 A1 | | 10/2019 |

OTHER PUBLICATIONS

Karahan et al. "Synthesis and evaluations of novel photoinitiators with side-chainbenzophenone, derived from alkyl alpha-hydroxymethacrylates", Journal of Photochemistry and Photobiology A: Chemistry, 274, (2014); pp. 43-49.*

International Search Report issued for International Application No. PCT/KR2020/018090 on Mar. 26, 2021, 4 pages.

\* cited by examiner

[Fig.1]
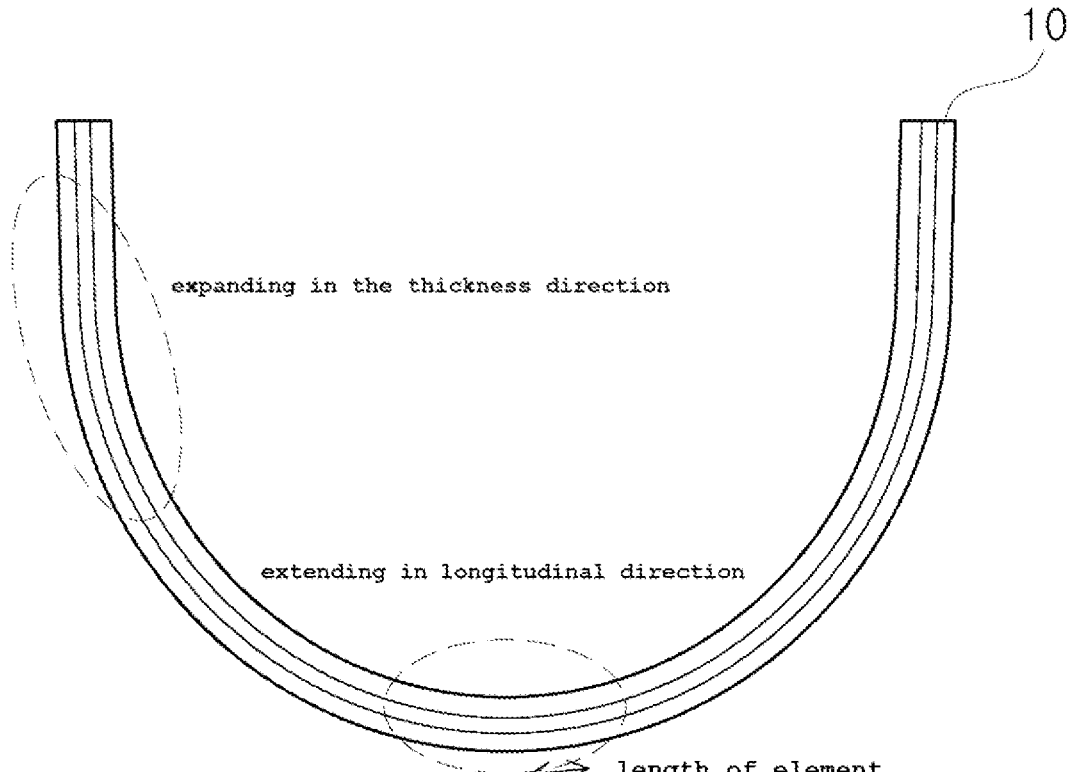

[Fig.2]
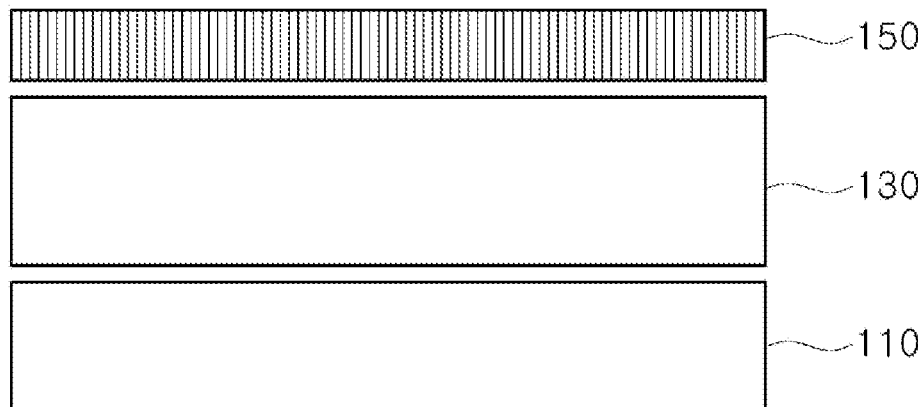
100
150
130
110
Fig.3 (a)
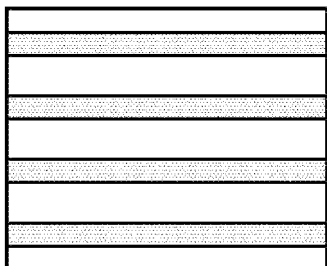
Fig.3 (b)
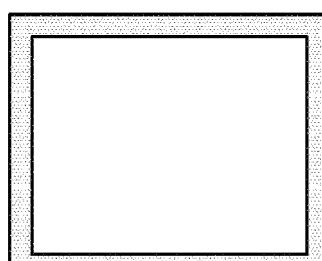
Fig.3 (c)
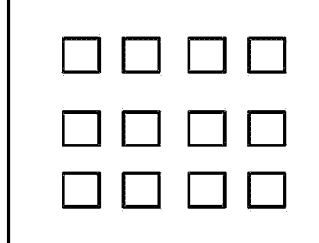

[Fig.5]
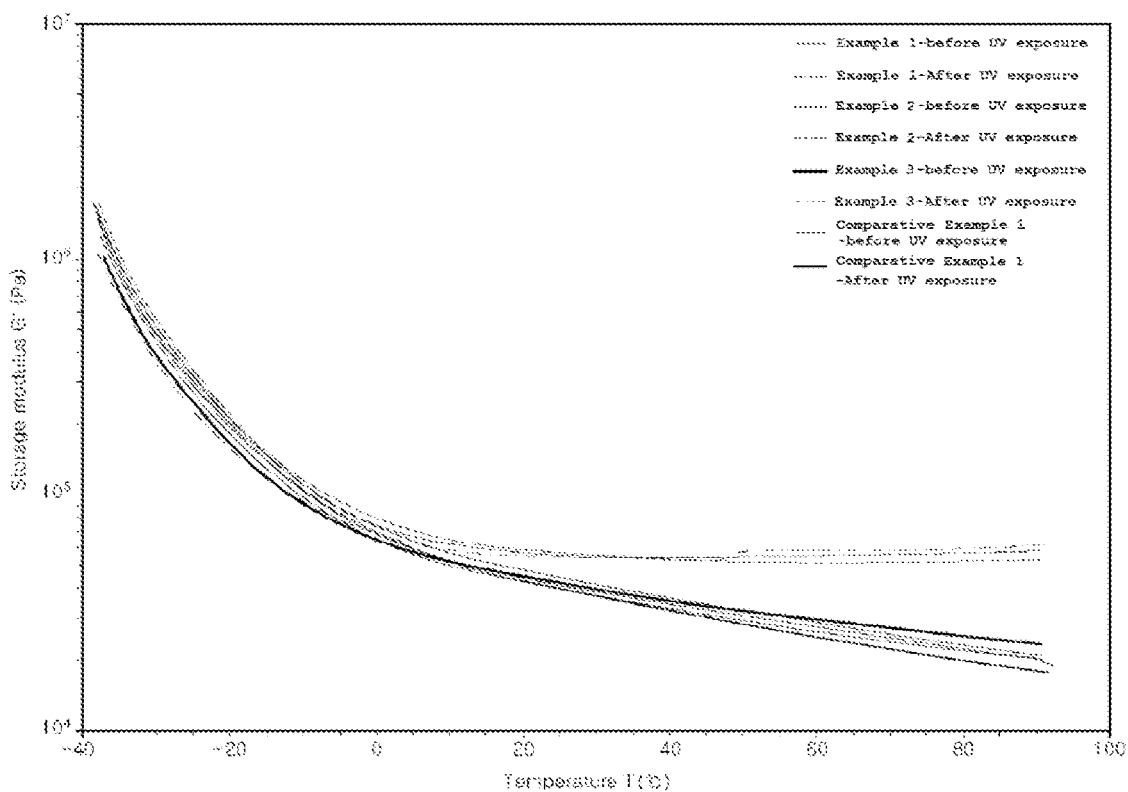
Fig.6 (a)
Fig.6 (b)
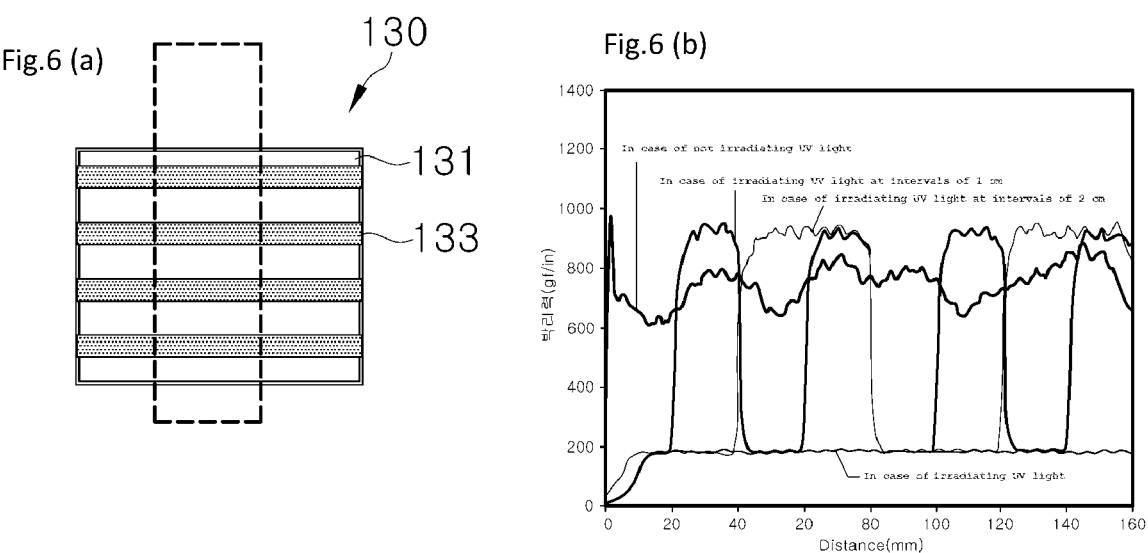

[Fig.7]
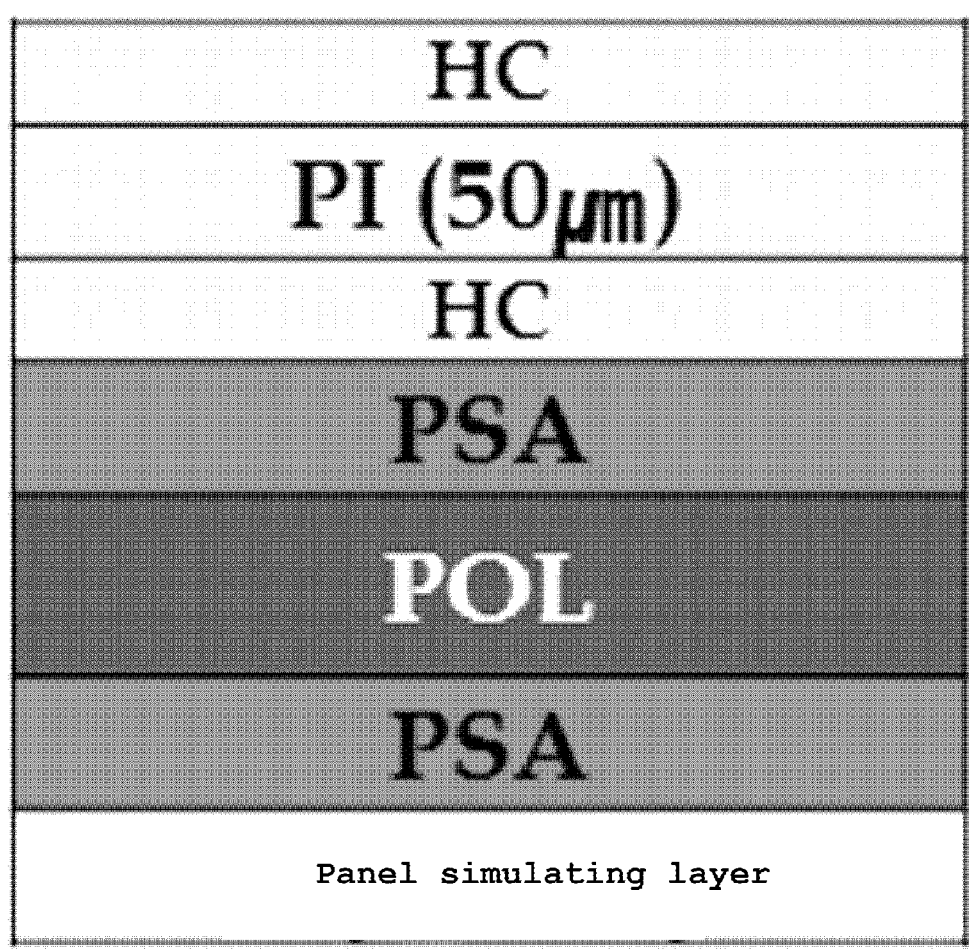

[Fig.8]
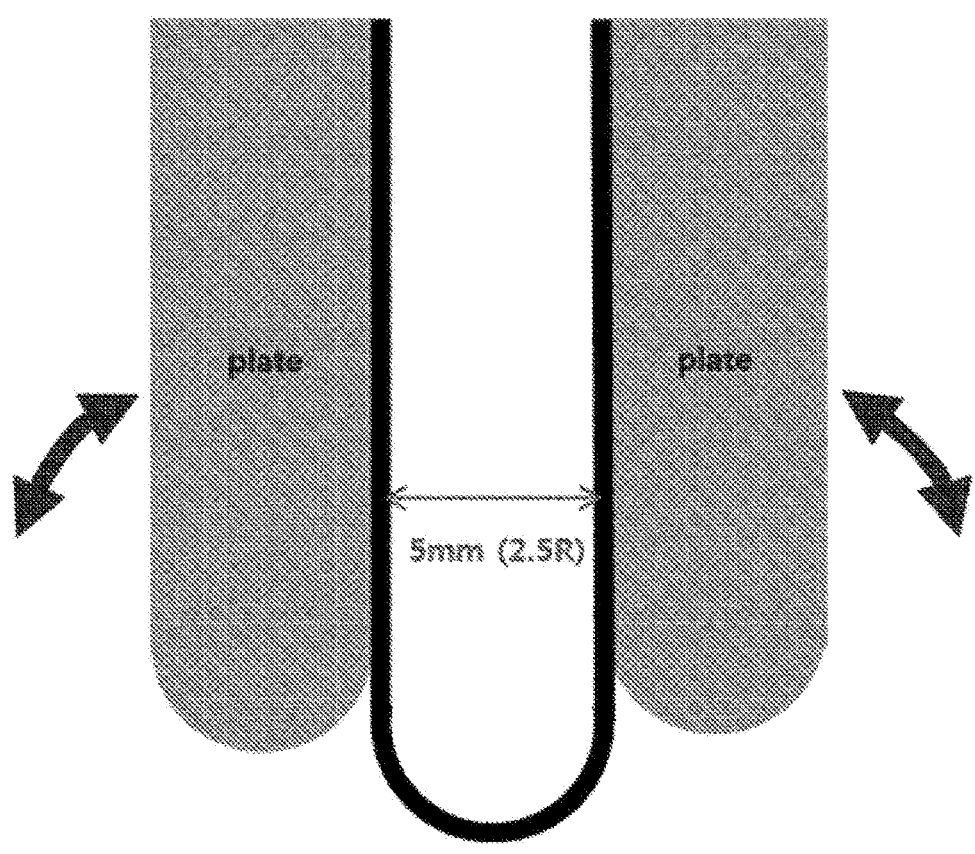

[Fig.9]
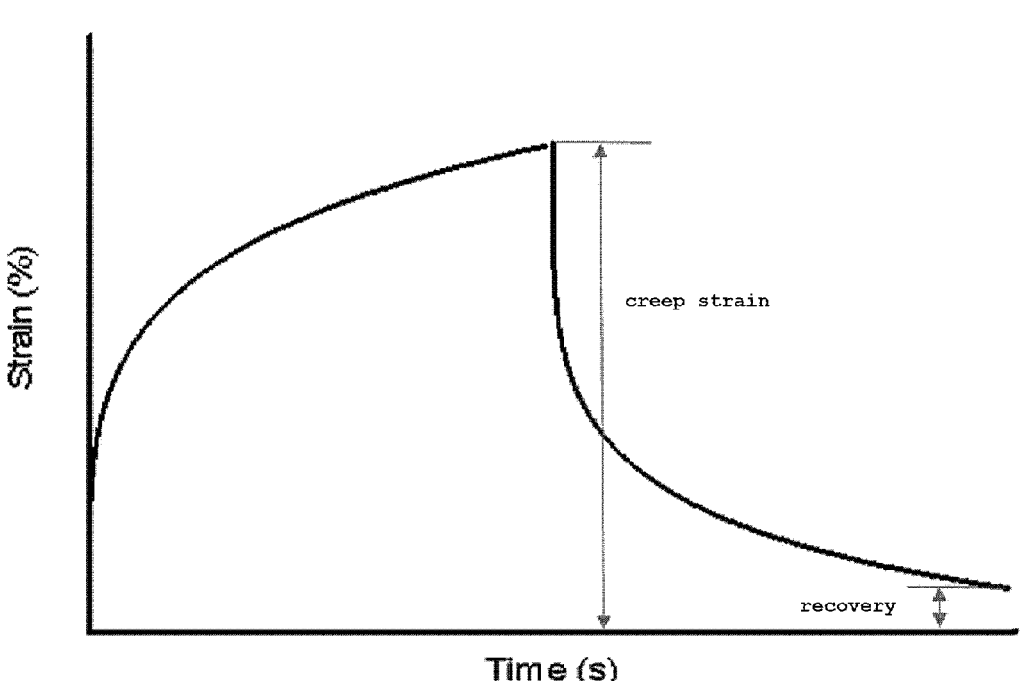

MULTI-REGION FOLDABLE ADHESIVE FILM AND FABRICATION METHOD THEREFOR

TECHNICAL FIELD

This application is a 35 U.S.C. 371 National Phase Entry Application from PCT/KR2020/018090 filed on Dec. 10, 2020, which claims the benefits of the filing dates of Korean Patent Application No. 10-2019-0164158, filed on Dec. 10, 2019, in the Korean Intellectual Property Office, and of Korean Patent Application No. 10-2019-0167239, filed on Dec. 13, 2019, in the Korean Intellectual Property Office, all of the disclosures of which are incorporated herein in their entirety by reference.

The present invention relates to a multi-region foldable adhesive film and a fabrication method therefor, and particularly, to a multi-region foldable adhesive film having improved folding characteristics by making an adhesive layer included in the foldable adhesive film have different physical properties, and a fabrication method therefor.

BACKGROUND OF THE INVENTION

An adhesive film is fabricated to have uniform physical properties throughout the entire region of the adhesive film regardless of the chemical properties, surface roughness, required mechanical properties, viscosity and thermal properties of an adherend. However, when the adhesive film is used as an adhesive film for application to a foldable display, a problem may arise in that, because a folding portion and a non-folding portion in the adhesive film have the same physical properties, a fold mark occurs in the adhesive film, or bubbles or the like occur in the adhesive film.

For this reason, it has been required to improve the folding characteristics of the foldable adhesive film for application to a foldable display by making a folding portion and a non-folding portion in the foldable adhesive film have different physical properties.

Specifically, the foldable adhesive film is required to have different physical properties depending on the different regions thereof so that the stress relief efficiency or stress-relieving ability of only the folding portion of the foldable adhesive film may be selectively improved or maximized in order to minimize the stress that is applied to the folding portion or so that the recovery of the foldable adhesive film may be improved so that the foldable adhesive film can recover to its original state after folding.

FIG. 1 is a schematic diagram showing stresses caused by folding of a foldable adhesive film. Referring to FIG. 1, it can be seen that different positions of the foldable adhesive film undergo different stresses. Specifically, a force extending in the longitudinal direction is applied to the folding portion at the lower end of the foldable adhesive film. In contrast, a force expanding in the thickness direction is applied to the upper portion of the foldable adhesive film due to a force applied to the foldable adhesive film. Accordingly, even in a single foldable adhesive film, required physical properties differ between different regions of the foldable adhesive film.

Thus, when the foldable adhesive film is configured to have improved stress-relieving ability throughout the entire region thereof, a problem arises in that the occurrence of residue during cutting of the adhesive film increases, resulting in deterioration in the processing property of the adhesive film. On the other hand, when the foldable adhesive film is configured to have improved recovery throughout the entire region thereof, a problem arises in that the stress-relieving ability of the adhesive film is degraded, and thus cracks are caused by folding of the adhesive film. Furthermore, even when there is a stepped portion in a specific portion of an adherend, it may be required to improve the step coverage property of the foldable adhesive film by lowering the viscosity of only the portion of the adhesive film, which corresponds to the stepped portion.

Accordingly, there is an urgent need to develop technology related to a foldable adhesive film having physical properties that vary depending on the different regions of the foldable adhesive film.

BRIEF SUMMARY OF THE INVENTION

An object to be achieved by the present invention is to provide a multi-region foldable adhesive film having improved folding characteristics by adjusting the components and their contents in an adhesive composition included in the adhesive film so that a folding portion and a non-folding portion in the foldable adhesive film have different physical properties, and a fabrication method therefor.

However, the objects to be solved by the present invention are not limited to the above-mentioned object, and other objects which are not mentioned herein will be clearly understood by those skilled in the art from the following description.

One embodiment of the present invention provides a multi-region foldable adhesive film including: an adhesive layer including at least two regions having different crosslinking densities; and a substrate provided on one surface of the adhesive layer, wherein the adhesive layer includes a cured product of an adhesive composition containing: a polymer of a monomer mixture containing a (meth)acrylate monomer containing at least one alkyl group having 2 to 8 carbon atoms, a (meth)acrylate monomer containing a polar group, and a photoinitiator monomer; and a crosslinking agent.

Another embodiment of the present invention provides a method for fabricating a multi-region foldable adhesive film, the method including steps of: providing an adhesive composition containing: a polymer of a monomer mixture containing a (meth)acrylate monomer containing at least one alkyl group having 2 to 8 carbon atoms, a (meth)acrylate monomer containing a polar group, and a photoinitiator monomer; and a crosslinking agent; applying the adhesive composition onto a substrate; providing an adhesive layer by curing the adhesive composition; and forming at least two regions having different crosslinking densities and different physical properties by crosslinking the adhesive layer.

Advantageous Effects

The multi-region foldable adhesive film according to one embodiment of the present invention may have improved recovery characteristics and an improved stress-relieving rate by adjusting the components and their contents in an adhesive layer thereof so that a folding portion and a non-folding portion in the adhesive film have different physical properties.

The method for fabricating a multi-region foldable adhesive film according to another embodiment of the present invention may allow the regions having different crosslinking densities to be included at specific positions in the adhesive layer, and may adjust the physical properties of the regions having different crosslinking densities.

The effects of the present invention are not limited to the above-described effects, and effects which are not mentioned herein will be clearly understood by those skilled in the art from the present specification and the accompanying drawings.

BRIEF DESCRIPTION OF DRAWINGS

FIG. 1 is a schematic view showing stresses caused by folding of a foldable adhesive film.

FIG. 2 is a sectional view of a multi-region foldable adhesive film according to one embodiment of the present invention.

FIGS. 3(a), 3(b) and 3(c) each show schematic views of an adhesive layer including at least two regions having different crosslinking densities according to embodiments of the present invention.

FIG. 5 is a graph showing the storage moduli of adhesive films of Examples 1 to 3 and Comparative Example 1 before and after UV light irradiation.

FIGS. 6(a) and 6(b) is a schematic view of an adhesive film of Example 2 and a graph showing the adhesive strengths of the adhesive film of Example 2 before and after UV light irradiation.

FIG. 7 is a schematic view of a sample for a dynamic folding test.

FIG. 8 is a schematic view of a dynamic folding test.

FIG. 9 is a graph showing creep strain and recovery as a function of time.

DETAILED DESCRIPTION OF THE INVENTION

Figure 4:
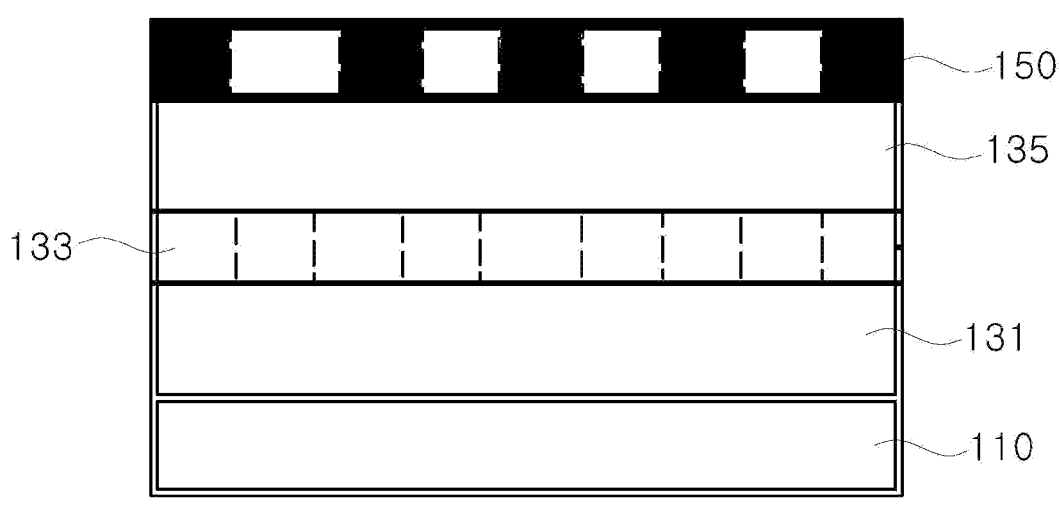
FIGS. 4(a) and 4(b) each are schematic views showing a sectional view of a multi-region adhesive film including regions having different crosslinking densities according to embodiments of the present invention.
Figure 4:
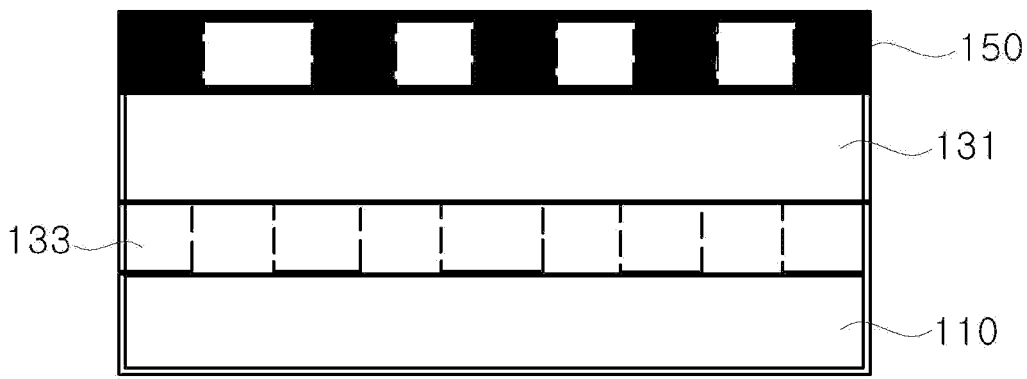

Throughout the present specification, it is to be understood that when any part is referred to as "including" any component, it does not exclude other components, but may further include other components, unless otherwise specified.

Throughout the present specification, when any member is referred to as being "on" another member, it not only refers to a case where any member is in contact with another member, but also a case where a third member exists between the two members.

Throughout the present specification, the unit "parts by weight" may refer to the ratio of weight between components.

Throughout the present specification, the term "(meth) acrylate" is meant to all include acrylate and methacrylate.

Throughout the present specification, "A and/or B" refers to "A and B" or "A or B".

Throughout the present specification, the term "monomer unit" may mean the reacted form of a monomer in a polymer, and specifically may mean a state in which the monomer forms the backbone of the polymer, for example, a main chain or a side chain, through a polymerization reaction.

Throughout the present specification, the "weight-average molecular weight" and "number-average molecular weight" of any compound may be calculated using the molecular weight and molecular weight distribution of the compound. Specifically, the molecular weight and molecular weight distribution of the compound may be obtained by: placing tetrahydrofuran (THF) and the compound in a 1-ml glass vial to prepare a test sample in which the concentration of the compound is 1 wt %; filtering a standard sample (polystyrene) and the test sample through a filter (pore size: 0.45 μm); injecting each of the sample filtrates into a GPC injector; and comparing the elution time of the test sample with a calibration curve of the standard sample. At this time, Infinity II 1260 (Agilent Technologies, Inc.) may be used as a measurement instrument, and the flow rate and the column temperature may be set to 1.00 mL/min and 40.0° C., respectively.

Throughout the present specification, "glass transition temperature (Tg)" may be measured using differential scanning calorimetry (DSC). Specifically, the glass transition temperature may be measured using a differential scanning calorimeter (DSC, DSC-STAR3, METTLER TOLEDO) by performing a two-cycle experiment in a temperature of −60° C. to 150° C. while heating a sample in the temperature range at a heating rate of 5° C./min, and then measuring the midpoint of the DSC curve plotted from points having thermal changes.

Hereinafter, the present invention will be described in more detail.

One embodiment of the present invention provides a multi-region foldable adhesive film including: an adhesive layer including at least two regions having different crosslinking densities; and a substrate provided on one surface of the adhesive layer, wherein the adhesive layer includes a cured product of an adhesive composition containing: a polymer of a monomer mixture containing a (meth)acrylate monomer containing at least one alkyl group having 2 to 8 carbon atoms, a (meth)acrylate monomer containing a polar group, and a photoinitiator monomer; and a crosslinking agent.

The multi-region foldable adhesive film according to one embodiment of the present invention may have improved recovery characteristics and an improved stress-relieving rate by adjusting the components and their contents in an adhesive layer thereof so that a folding portion and a non-folding portion in the adhesive film have different physical properties.

According to one embodiment of the present invention, the adhesive layer may include at least two regions having different crosslinking densities. Specifically, the number of the regions having different crosslinking densities and included in the adhesive layer may be 3 to 50, 4 to 49, 5 to 48, 6 to 47, 7 to 45, 8 to 40, 9 to 35, 10 to 30, 11 to 25, or 12 to 20. Where the number of the regions having different crosslinking densities and included in the adhesive layer is adjusted within the above-described range, it is possible for the foldable adhesive film to effectively relieve stress occurring during folding and it is possible to improve the recovery of the adhesive film.

According to one embodiment of the present invention, the crosslinking density may be adjusted through the heating time or the E-beam or UV irradiation time or wavelength. By adjusting the crosslinking density as described above, it is possible to adjust the adhesive strength, elasticity modulus, storage modulus, creep strain, recovery, viscosity, and glass transition temperature, which are physical properties to be achieved in the multi-region foldable adhesive film.

According to one embodiment of the present invention, the foldable adhesive film may include a substrate provided on one surface of the adhesive layer. Specifically, by including the substrate, it is possible to ensure the basic physical properties of the multi-region foldable adhesive film and protect the screen of a foldable display device to which the multi-region foldable adhesive film is applied.

According to one embodiment of the present invention, the substrate may be a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film, or a polyimide film, but is not limited thereto.

According to one embodiment of the present invention, the thickness of the substrate may be 10 μm to 150 μm, 50 μm to 125 μm, or 50 μm to 100 μm. By adjusting the thickness of the substrate within the above-described range, it is possible for the foldable adhesive film to effectively relieve stress occurring during folding and it is possible to improve the recovery of the film.

According to one embodiment of the present invention, the multi-region foldable adhesive film may further include a release film as described below. FIG. 2 is a sectional view of the multi-region foldable adhesive film according to one embodiment of the present invention. Referring to FIG. 2, the multi-region foldable adhesive film may be fabricated by sequentially laminating the substrate, the adhesive layer and the release film. Furthermore, the release film may include patterns corresponding to patterns formed by the regions having different crosslinking densities as described below.

FIG. 3 is a schematic view showing an adhesive layer including at least two regions having different crosslinking densities according to one embodiment of the present invention. Referring to FIG. 3, the regions having different crosslinking densities according to one embodiment of the present invention may be at least two regions, and may have various patterns to achieve the folding characteristics of the foldable adhesive film.

According to one embodiment of the present invention, the regions having different crosslinking densities may be a plurality of regions that are included in a direction parallel to the folding axis of the multi-region foldable adhesive film. Specifically, the regions having different crosslinking densities may be included in a direction parallel to the folding axis of the multi-region foldable adhesive film. More specifically, the regions having different crosslinking densities may be a plurality of regions that are included in a direction horizontal to the folding axis of the multi-region foldable adhesive film. Where the regions having different crosslinking densities are included in a direction parallel to the folding axis of the multi-region foldable adhesive film as described above, it is possible to improve the recovery of the foldable adhesive film and effectively relieve stress.

According to one embodiment of the present invention, the regions having different crosslinking densities may be a plurality of regions that are included in a direction forming an angle with the folding axis of the multi-region foldable adhesive film. Specifically, the regions having different crosslinking densities may be included in a direction forming an angle with the folding axis of the multi-region foldable adhesive film. More specifically, the regions having different crosslinking densities may be a plurality of regions that are included in a direction vertical to the folding axis of the multi-region foldable adhesive film. Where the regions having different crosslinking densities are included in a direction forming an angle with the folding axis of the multi-region foldable adhesive film as described above, it is possible to maximize the recovery of the foldable adhesive film.

According to one embodiment of the present invention, the regions having different crosslinking densities may be provided to form a closed curve, as shown in FIG. 3(c). More specifically, the closed curve may be formed in a circular, oval, triangular, rectangular or polygonal shape, and the shape of the closed curve is not limited to the above-described shape.

According to one embodiment of the present invention, the regions having different crosslinking densities may be included inside the adhesive layer. That is, the regions having different crosslinking densities may be provided inside the adhesive layer so as not to be exposed to the surface of the adhesive layer. Specifically, FIG. 4 is a schematic view showing a sectional view of a multi-region adhesive film including regions having different crosslinking densities according to one embodiment of the present invention. Referring to FIG. 4(a), the regions having different crosslinking densities may be formed at positions spaced apart from the substrate and the release film in the adhesive layer. More specifically, the distances by which the regions are spaced apart from the substrate and the release film may be the same or different. Where the regions having different crosslinking densities are located inside the adhesive layer as described above, it is possible to adjust the physical properties to be achieved in the foldable adhesive film and to effectively reduce the stress caused by folding while improving the recovery of the foldable adhesive film by adjusting only the folding position of the foldable adhesive film to have a different physical property.

According to one embodiment of the present invention, the regions having different crosslinking densities may be included in the surface of the adhesive layer on which the substrate is provided. That is, the regions having different crosslinking densities may be provided to be exposed to one surface of the adhesive layer on which the substrate is provided. Specifically, referring to FIG. 4(b), regions having different crosslinking densities may be included so as to contact the substrate. Where the regions having different crosslinking densities are included so as to contact the substrate as described above, it is possible to effectively relieve the stress generated in the substrate and to attach the adhesive layer depending on the curvature of the adherend, thus improving the step coverage property of the adhesive film.

According to one embodiment of the present invention, the foldable adhesive film may further include a release film provided on a surface of the adhesive layer, which is opposite to a surface thereof on which the substrate is provided. Specifically, as the release film, a release film as shown in FIG. 2 may be included. Where the release film is provided on the adhesive layer as described above, it is possible to improve the usability of the multi-region foldable adhesive film and to differently adjust the physical properties of the adhesive layer by allowing the release film to block UV light or the like with which the adhesive layer is irradiated as described later.

According to one embodiment of the present invention, the release film may include patterns corresponding to patterns formed by the regions having different crosslinking densities. Specifically, where patterns corresponding to positions at which the regions having different crosslinking densities are to be formed are formed in the release film, followed by UV light irradiation from the release film to the adhesive layer as described later, it is possible to form the regions having different crosslinking densities in desired regions.

According to one embodiment of the present invention, the difference in physical property between the regions having different crosslinking densities may be 10% or more.

Specifically, the difference in physical property between the regions having different crosslinking densities may be 10% to 100%, 15% to 95%, 20% to 90%, 30% to 80%, 40% to 70%, or 50% to 60%. Where the difference in physical properties is adjusted within the above-described range, it is possible to allow the foldable adhesive film to have different physical properties at different positions thereof while improving the recovery thereof, and it is possible to effectively relieve stress that is applied during folding.

According to one embodiment of the present invention, the physical property may be one selected from the group consisting of elastic modulus at 80° C., elongation at 20° C., creep strain at 20° C., recovery at 20° C., hardness at 20° C., viscosity at 50° C., and combinations thereof. By selecting the physical property from among those described above, it is possible to adjust the required physical property of the foldable adhesive film depending on a position.

Referring to FIG. 1, it can be seen that stresses applied to the foldable adhesive film during folding are different. Specifically, the lower end of the folded foldable adhesive film extends in the longitudinal direction, and the upper portion thereof expands in the thickness direction. Thus, the storage moduli of the foldable adhesive film are different between before and after the regions having different crosslinking densities are formed by additional curing. When the storage modulus of the foldable adhesive film is high, the shear adhesive strength thereof will increase, leading to improvement in the durability thereof, and the degree of bending at the hinge portion thereof during folding will decrease. On the contrary, when the storage modulus of the foldable adhesive film is low, the ability to relieve stress will be improved, so that the stress that is applied to the hinge portion thereof during folding will decrease. Thus, where the folding position of the foldable adhesive film is adjusted to have a different physical property, it is possible to increase the durability of the foldable adhesive film by improving the recovery or stress-relieving ability thereof.

According to one embodiment of the present invention, the adhesive layer may include a cured product of an adhesive composition containing: a polymer of a monomer mixture containing a (meth)acrylate monomer containing at least one alkyl group having 2 to 8 carbon atoms, a (meth) acrylate monomer containing a polar group, and a photoinitiator monomer; and a crosslinking agent. Where the adhesive layer includes the components of the adhesive composition as described above, it is possible to ensure the physical properties of the multi-region foldable adhesive film and to improve the recovery of the foldable adhesive film during folding by improving the storage modulus thereof.

According to one embodiment of the present invention, the monomer mixture may contain a (meth)acrylate monomer containing at least one alkyl group having 2 to 8 carbon atoms. Specifically, examples of the (meth)acrylate monomer may include ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, and isooctyl (meth) acrylate. Among the above-described monomers, one or a mixture of two or more may be included in the adhesive layer. More specifically, the adhesive layer preferably includes 2-ethylhexyl (meth)acrylate.

According to one embodiment of the present invention, the monomer mixture may contain a (meth)acrylate monomer containing a polar group. Specifically, examples of the (meth)acrylate monomer having a polar group include (meth)acrylate monomers in which a substituent group containing an atom other than carbon and hydrogen is ester-bonded. Examples of the substituent group include a hydroxyl group, an epoxy group, a glycidyl ether group, a tetrahydrofurfuryl group, an isocyanate group, a carboxyl group, an alkoxysilyl group, a phosphate ester group, a lactone group, an oxetane group, a tetrahydropyranyl group, and an amino group. More specifically, the polar group is preferably a hydroxyl group or a carboxyl group.

According to one embodiment of the present invention, examples of the (meth)acrylate monomer containing a polar group include acrylic acid, 2-hydroxyethyl (meth)acrylate, 2-hydroxypropyl (meth)acrylate, 2-hydroxybutyl (meth) acrylate, 4-hydroxybutyl (meth)acrylate, cyclohexane dimethanol mono(meth)acrylate, glycidyl (meth)acrylate, 4-hydroxybutyl acrylate glycidyl ether, tetrahydrofurfuryl (meth) acrylate, 2-isocyanatoethyl (meth)acrylate, 2-(meth) acryloyloxyethyl succinate, 2-(meth)acryloyloxyethyl hexahydrophthalate, 3-(meth)acryloxypropyltrimethoxysilane, 3-(meth)acryloxypropylmethyldimethoxysilane, 3-(meth)acryloxypropyltriethoxysilane, 3-(meth)acryloxypropylmethyldiethoxysilane, 2-(meth)acryloyloxyethyl phosphate, γ-butyllactone (meth)acrylate, (3-methyl-3-oxetanyl) (meth)acrylate, (3-ethyl-3-oxetanyl) (meth)acrylate, tetrahydrofurfuryl (meth)acrylate, dimethylaminoethyl (meth)acrylate, and diethylaminoethyl (meth)acrylate. More specifically, the (meth)acrylate monomer containing a polar group may be acrylic acid. Where the (meth)acrylate monomer containing a polar group is selected from those described above, it is possible to improve the storage modulus of the foldable adhesive film.

According to one embodiment of the present invention, the monomer mixture may contain a photoinitiator monomer. Specifically, the photoinitiator monomer is activated by UV light or an electron beam, and functions to activate a carbon-carbon double bond in the adhesive layer, causing a radical reaction. The photoinitiator monomer may be an alpha-hydroxy ketone-based compound, a benzyl ketal-based compound, or a mixture thereof, but is not limited thereto. Preferably, the photoinitiator monomer may be a benzophenone-based compound, that is, a benzophenone derivative. The above-described photoinitiator monomers may be used alone or in combination of two or more.

According to one embodiment of the present invention, the photoinitiator monomer may be a benzophenone derivative. Specifically, the photoinitiator monomer is preferably one selected from among benzophenone (meth)acrylate, benzoylphenyl (meth)acrylate, N-(2-benzoylphenyl)acrylamide, and mixtures thereof. By selecting the photoinitiator monomer from those described above, it is possible to ensure regions having different physical properties even in the adhesive layer by UV-irradiating regions in the adhesive layer, the physical properties of which need to be changed.

According to one embodiment of the present invention, the adhesive composition may include a polymer of a monomer mixture containing a (meth)acrylate monomer containing at least one alkyl group having 2 to 8 carbon atoms, a (meth)acrylate monomer containing a polar group, and a photoinitiator monomer. By including the polymer as described above, it is possible to adjust the crosslinking density of the adhesive layer and adjust the physical properties of the adhesive layer of the multi-region foldable adhesive film.

According to one embodiment of the present invention, the adhesive composition may contain a crosslinking agent. Specifically, examples of the crosslinking agent include, but are not limited to, bifunctional acrylates such as 1,4-butanediol di(meth)acrylate, 1,6-hexanediol di(meth) acrylate, neopentylglycol di(meth)acrylate, polyethyleneglycol di(meth)acrylate, neopentylglycol adipate di(meth)acrylate, dicyclopentanyl di(meth)acrylate, caprolactone-modified dicyclopentenyl di(meth)acrylate, ethylene oxide-modified di(meth)acrylate, di(meth)acryloxy ethyl isocyanurate, allylated cyclohexyl di(meth)acrylate, tricyclodecanedimethanol (meth)acrylate, dimethylol dicyclopentanedi(meth)acrylate, ethylene oxide-modified hexahydrophthalic acid di(meth)acrylate, tricyclodecane dimethanol (meth)acrylate, neopentyl glycol-modified trimethylpropane di(meth)acrylate, adamantane di(meth)acrylate or 9,9-bis[4-(2-acryloyloxyethoxy)phenyl]fluorene; trifunctional acrylates such as trimethylolpropane tri(meth)acrylate, dipentaerythritol tri (meth)acrylate, propionic acid-modified dipentaerythritol tri (meth)acrylate, pentaerythritol tri(meth)acrylate, propylene oxide-modified trimethylolpropane tri(meth)acrylate, trifunctional urethane (meth)acrylate or tris(meth)acryloxyethyl isocyanurate; tetrafunctional acrylates such as diglycerin tetra(meth)acrylate or pentaerythritol tetra(meth) acrylate; pentafunctional acrylates such as dipentaerythritol penta(meth)acrylate; and hexafunctional acrylates such as dipentaerythritol hexa(meth)acrylate, caprolactone-modified dipentaerythritol hexa(meth)acrylate, or urethane (meth)acrylates (for example, reaction products of an isocyanate monomer and trimethylolpropane tri(meth)acrylate). These may be used alone or in combination of two or more. By selecting the crosslinking agent from those described above, it is possible to adjust the crosslinking density of the adhesive layer and adjust the physical properties of the adhesive layer of the multi-region foldable adhesive film.

According to one embodiment of the present invention, the crosslinking agent may include one selected from among an isocyanate-based crosslinking agent, an epoxy-based crosslinking agent, and a mixture thereof. More specifically, the isocyanate-based crosslinking agent may be one selected from the group consisting of ethylene diisocyanate, 1,4-tetramethylene diisocyanate, 1,6-hexamethylene diisocyanate (HDI), 1,12-dodecane diisocyanate, cyclobutane-1,3-diisocyanate, cyclohexane-1,3-diisocyanate, cyclohexane-1, 4-diisocyanate, 1-isocyanato-3,3,5-trimethyl-5-isocyanatomethyl-cyclohexane, 2,4-hexahydrotoluene diisocyanate, 2,6-hexahydrotoluene diisocyanate, hexahydro-1,3-phenylene diisocyanate, hexahydro-1,4-phenylene diisocyanate, perhydro-2,4'-diphenylmethane diisocyanate, perhydro-4,4'-diphenylmethane diisocyanate, 1,3-phenylene diisocyanate, 1,4-phenylene diisocyanate, 4,4'-stilbene diisocyanate, 3,3'-dimethyl-4,4'-biphenylene diisocyanate (TODI), toluene 2,4-diisocyanate, toluene 2,6-diisocyanate (TDI), diphenylmethane-2,4'-diisocyanate (MDI), 2,2'-diphenylmethane diisocyanate (MDI), diphenylmethane-4,4'-diisocyanate (MDI), isophorone diisocyanate (IPDI), and combinations thereof. In addition, the epoxy-based crosslinking agent may be one selected from the group consisting of ethylene glycol diglycidyl ether, triglycidyl ether, trimethylolpropane triglycidyl ether, N,N,N',N'-tetraglycidyl ethylenediamine, glycerin diglycidyl ether, and combinations thereof. By selecting the crosslinking agent from those described above, it is possible to adjust the crosslinking density of the adhesive layer and adjust the physical properties of the adhesive layer of the multi-region foldable adhesive film.

According to one embodiment of the present invention, the isocyanate-based crosslinking agent may be a polyfunctional crosslinking agent. Specifically, the isocyanate-based crosslinking agent may be one, two or more selected from among aliphatic diisocyanate compounds such as 2,2-dimethylpentane diisocyanate, hexamethylene diisocyanate, 2,2, 4-trimethylhexane diisocyanate, butene diisocyanate, 1,3-butadiene-1,4-diisocyanate, 2,4,4-trimethylhexamethylene diisocyanate, 1,6,11-undecane triisocyanate, 1,3,6-hexamethylene triisocyanate, 1,8-diisocyanate-4-isocyanatomethyloctane, bis(isocyanatoethyl)carbonate, and bis(isocyanatoethyl)ether; alicyclic isocyanate compounds such as isophorone diisocyanate, 1,2-bis(isocyanatomethyl)cyclohexane, 1,3-bis(isocyanatomethyl)cyclohexane, 1,4-bis(isocyanatomethyl)cyclohexane, dicyclohexylmethane diisocyanate, cyclohexane diisocyanate, methylcyclohexane diisocyanate, dicyclohexyldimethylmethane isocyanate, and 2,2-dimethyldicyclohexylmethane isocyanate; aromatic isocyanate compounds such as xylylene diisocyanate (XDI), bis(isocyanatoethyl)benzene, bis(isocyanatopropyl)benzene, bis(isocyanatobutyl)benzene, bis(isocyanatomethyl) naphthalene, bis(isocyanatomethyl)diphenyl ether, phenylene diisocyanate, ethylphenylene diisocyanate, isopropylphenylene diisocyanate, dimethylphenylene diisocyanate, diethylphenylene diisocyanate, diisopropylphenylene diisocyanate, trimethylbenzene triisocyanate, benzene triisocyanate, biphenyl diisocyanate, toluidine diisocyanate, 4,4-diphenylmethane diisocyanate, 3,3-dimethyldiphenyl methane-4,4-diisocyanate, bibenzyl-4,4-diisocyanate, bis(isocyanatophenyl)ethylene, 3,3-dimethoxybiphenyl-4,4-diisocyanate, hexahydrobenzene diisocyanate, and hexahydrodiphenylmethane-4,4-diisocyanate; sulfur-containing aliphatic isocyanate compounds such as bis(isocyanatoethyl)sulfide, bis(isocyanatopropyl)sulfide, bis(isocyanatohexyl)sulfide, bis(isocyanatomethyl)sulfone, bis(isocyanatomethyl)disulfide, bis(isocyanatopropyl)disulfide, bis(isocyanatomethylthio)methane, bis(isocyanatoethylthio)methane, bis(isocyanatoethylthio)ethane, bis(isocyanatomethylthio)ethane, and 1,5-diisocyanato-2-isocyanatomethyl-3-thiapentane; sulfur-containing aromatic isocyanate compounds such as diphenylsulfide-2,4-diisocyanate, diphenylsulfide-4,4-diisocyanate, 3,3-dimethoxy-4, 4-diisocyanatodibenzylthioether, bis(4-isocyanatomethylbenzene)sulfide, 4,4-methoxybenzenethioethyleneglycol-3, 3-diisocyanate, diphenyldisulfide-4,4-diisocyanate, 2,2-dimethyldiphenyldisulfide-5,5-diisocyanate, 3,3-dimethyldiphenyldisulfide-5,5-diisocyanate, 3,3-dimethyldiphenyldisulfide-6,6-diisocyanate, 4,4-dimethyldiphenyldisulfide-5,5-diisocyanate, 3,3-dimethoxy diphenyldisulfide-4,4-diisocyanate, and 4,4-dimethoxydiphenyldisulfide-3,3-diisocyanate; and sulfur-containing heterocyclic isocyanate compounds such as 2,5-diisocyanatothiophene, 2,5-bis(isocyanatomethyl)thiophene, 2,5-diisocyanatotetrahydrothiophene, 2,5-bis(isocyanatomethyl)tetrahydrothiophene, 3,4-bis(isocyanatomethyl)tetrahydrothiophene, 2,5-diisocyanato-1, 4-dithiane, 2,5-bis(isocyanatomethyl)-1,4-dithiane, 4,5-diisocyanato-1,3-dithiolane, 4,5-bis(isocyanatomethyl)-1,3-dithiolane, and 4,5-bis(isocyanatomethyl)-2-methyl-1,3-dithiolane. In addition, one, two or more compounds having at least one isocyanate and/or isothiocyanate group may be used. In addition, it is also possible to use halogen-substitution products, such as chlorine-substitution products and bromine-substitution products of these isocyanate compounds, or alkyl-substitution products, alkoxy-substitution products, nitro-substitution products, prepolymer type modification products with polyhydric alcohol or thiol, carbodiimide-modified products, urea-modified products, biuret-modified products, or dimerization or trimerization products of these isocyanate compounds.

According to one embodiment of the present invention, the monomer mixture may further contain one selected from the group consisting of a reaction initiator, a chain transfer agent, other additives, and combinations thereof. Specifically, the reaction initiator may be azobisisobutyronitrile (AIBN), and the chain transfer agent may be n-dodecylmercaptan. Where the monomer mixture further contains one selected from among those described above, it is possible to adjust the desired physical properties.

According to one embodiment of the present invention, the monomer mixture and/or the adhesive composition may further contain a solvent. Specifically, the monomer mixture and/or the adhesive composition may further contain ethyl acetate as a solvent. By selecting the solvent as described above, it is possible to appropriately adjust the viscosity of the composition without changing the properties of the composition.

According to one embodiment of the present invention, the glass transition temperature of the (meth)acrylate monomer containing at least one alkyl group may be −80° C. to −30° C. Specifically, the glass transition temperature of the (meth)acrylate monomer containing at least one alkyl group may be −75° C. to −35° C., −70° C. to −40° C., −68° C. to −45° C., or −65° C. to −50° C. Where the glass transition temperature of the (meth)acrylate monomer containing at least one alkyl group is adjusted within the above-described range, it is possible to improve the stress relief efficiency of the adhesive layer by adjusting the storage modulus thereof.

According to one embodiment of the present invention, the glass transition temperature of the (meth)acrylate monomer containing a polar group may be −40° C. to 150° C. Specifically, the glass transition temperature of the (meth) acrylate monomer containing a polar group may be 50° C. to 150° C., 60° C. to 140° C., 65° C. to 135° C., 70° C. to 130° C., 75° C. to 125° C., 80° C. to 120° C., 85° C. to 115° C., 90° C. to 110° C., or 95° C. to 105° C. Where the glass transition temperature of the (meth)acrylate monomer containing a polar group is adjusted within the above-described range, it is possible to improve the stress relief efficiency of the adhesive layer by adjusting the storage modulus thereof.

According to one embodiment of the present invention, the content of the (meth)acrylate monomer containing at least one alkyl group may be 90 wt % to 99.9 wt %. Specifically, the content of the (meth)acrylate monomer containing at least one alkyl group may be 95 wt % to 99.9 wt %, or 98 wt % to 99.9 wt %. Where the content of the (meth)acrylate monomer containing at least one alkyl group is adjusted within the above-described range, it is possible to satisfy the physical properties of the adhesive layer and to effectively relieve the stress caused by folding by adjusting the modulus of the cured product of the adhesive composition.

According to one embodiment of the present invention, the content of the (meth)acrylate monomer containing a polar group may be 0.1 wt % to 10.0 wt %. Specifically, the content of the (meth)acrylate monomer containing a polar group may be 0.1 wt % to 5.0 wt %, 0.1 wt % to 3.0 wt %, or 0.1 wt % to 2.0 wt %. Where the content of the (meth)acrylate monomer containing a polar group is adjusted within the above-described range, it is possible to adjust the modulus of the cured product of the adhesive composition.

According to one embodiment of the present invention, the content of the photoinitiator monomer may be 0.01 parts by weight to 5.00 parts by weight based on 100 parts by weight of the sum total of the (meth)acrylate monomer containing an alkyl group and the (meth)acrylate monomer containing a polar group. Specifically, the content of the photoinitiator monomer may be 0.01 parts by weight to 4.0 parts by weight, 0.01 parts by weight to 3.0 parts by weight, 0.01 parts by weight to 2.0 parts by weight, 0.01 parts by weight to 1.0 part by weight, 0.01 parts by weight to 0.5 parts by weight, or 0.01 parts by weight to 0.1 parts by weight, based on 100 parts by weight of the sum total of the (meth)acrylate monomer containing an alkyl group and the (meth)acrylate monomer containing a polar group. By adjusting the content of the photoinitiator monomer within the above-described range, it is possible to adjust the physical properties of regions of the multi-region foldable adhesive film, which need to have different physical properties.

Another embodiment of the present invention provides a method for fabricating a multi-region foldable adhesive film, the method including steps of: providing an adhesive composition containing: a polymer of a monomer mixture containing a (meth)acrylate monomer containing at least one alkyl group having 2 to 8 carbon atoms, a (meth)acrylate monomer containing a polar group, and a photoinitiator monomer; and a crosslinking agent; applying the adhesive composition onto a substrate; providing an adhesive layer by curing the adhesive composition; and forming at least two regions having different crosslinking densities and different physical properties by crosslinking the adhesive layer.

The method for fabricating a multi-region foldable adhesive film according to another embodiment of the present invention may allow the regions having different crosslinking densities to be included at specific positions in the adhesive layer, and may adjust the physical properties of the regions having different crosslinking densities.

According to one embodiment of the present invention, the method includes a step of providing an adhesive composition containing: a polymer of a monomer mixture containing a (meth)acrylate monomer containing at least one alkyl group having 2 to 8 carbon atoms, a (meth)acrylate monomer containing a polar group, and a photoinitiator monomer; and a crosslinking agent.

According to one embodiment of the present invention, the monomer mixture may contain a (meth)acrylate monomer containing at least one alkyl group having 2 to 8 carbon atoms. Specifically, examples of the (meth)acrylate monomer include ethyl (meth)acrylate, n-propyl (meth)acrylate, isopropyl (meth)acrylate, n-butyl (meth)acrylate, t-butyl (meth)acrylate, sec-butyl (meth)acrylate, pentyl (meth)acrylate, 2-ethylhexyl (meth)acrylate, 2-ethylbutyl (meth)acrylate, n-octyl (meth)acrylate, and isooctyl (meth)acrylate. Among the above-described monomers, one or a mixture of two or more may be included in the adhesive layer. More specifically, the adhesive layer preferably includes 2-ethylhexyl (meth)acrylate.

According to one embodiment of the present invention, the monomer mixture may contain a (meth)acrylate monomer containing a polar group. Specifically, examples of the (meth)acrylate monomer having a polar group include (meth)acrylate monomers in which a substituent group containing an atom other than carbon and hydrogen is ester-bonded. Examples of the substituent group include a hydroxyl group, an epoxy group, a glycidyl ether group, a tetrahydrofurfuryl group, an isocyanate group, a carboxyl group, an alkoxysilyl group, a phosphate ester group, a lactone group, an oxetane group, a tetrahydropyranyl group, and an amino group. More specifically, the polar group is preferably a hydroxyl group or a carboxyl group.

According to one embodiment of the present invention, examples of the (meth)acrylate monomer containing a polar group include acrylic acid, 2-hydroxyethyl (meth)acrylate, 2-hydroxypropyl (meth)acrylate, 2-hydroxybutyl (meth) acrylate, 4-hydroxybutyl (meth)acrylate, cyclohexane dimethanol mono(meth)acrylate, glycidyl (meth)acrylate, 4-hydroxybutyl acrylate glycidyl ether, tetrahydrofurfuryl (meth) acrylate, 2-isocyanatoethyl (meth)acrylate, 2-(meth) acryloyloxyethyl succinate, 2-(meth)acryloyloxyethyl hexahydrophthalate, 3-(meth)acryloxypropyltrimethoxysilane, 3-(meth)acryloxypropylmethyldimethoxysilane, 3-(meth)acryloxypropyltriethoxysilane, 3-(meth)acryloxypropylmethyldiethoxysilane, 2-(meth)acryloyloxyethyl phosphate, γ-butyllactone (meth)acrylate, (3-methyl-3-oxetanyl) (meth)acrylate, (3-ethyl-3-oxetanyl) (meth)acrylate, tetrahydrofurfuryl (meth)acrylate, dimethylaminoethyl (meth)acrylate, and diethylaminoethyl (meth)acrylate. More specifically, the (meth)acrylate monomer containing a polar group may be acrylic acid. Where the (meth)acrylate monomer containing a polar group is selected from among those described above, it is possible to improve the storage modulus of the foldable adhesive film.

According to one embodiment of the present invention, the monomer mixture may contain a photoinitiator monomer. Specifically, the photoinitiator monomer is activated by UV light or an electron beam, and functions to activate a carbon-carbon double bond in the adhesive layer, causing a radical reaction. The photoinitiator monomer may be an alpha-hydroxy ketone-based compound, a benzyl ketal-based compound, or a mixture thereof, but is not limited thereto. Preferably, the photoinitiator monomer may be a benzophenone-based compound, that is, a benzophenone derivative. The above-described photoinitiator monomers may be used alone or in combination of two or more.

According to one embodiment of the present invention, the photoinitiator monomer may be a benzophenone derivative. Specifically, the photoinitiator monomer is preferably one selected from among benzophenone (meth)acrylate, benzoylphenyl (meth)acrylate, N-(2-benzoylphenyl)acrylamide, and mixtures thereof. By selecting the photoinitiator monomer from those described above, it is possible to ensure regions having different physical properties even in the adhesive layer by UV-irradiating regions in the adhesive layer, the physical properties of which need to be changed.

According to one embodiment of the present invention, the adhesive composition may contain a polymer of a monomer mixture containing a (meth)acrylate monomer containing at least one alkyl group having 2 to 8 carbon atoms, a (meth)acrylate monomer containing a polar group, and a photoinitiator monomer. By containing the polymer as described above, it is possible to adjust the crosslinking density of the adhesive layer and adjust the physical properties of the adhesive layer of the multi-region foldable adhesive film.

According to one embodiment of the present invention, the adhesive composition may contain a crosslinking agent. Specifically, examples of the crosslinking agent include, but are not limited to, bifunctional acrylates such as 1,4-butanediol di(meth)acrylate, 1,6-hexanediol di(meth) acrylate, neopentylglycol di(meth)acrylate, polyethyleneglycol di(meth)acrylate, neopentylglycol adipate di(meth)acrylate, dicyclopentanyl di(meth)acrylate, caprolactone modified dicyclopentenyl di(meth)acrylate, ethylene oxide modified di(meth)acrylate, di(meth)acryloxy ethyl isocyanurate, allylated cyclohexyl di(meth)acrylate, tricyclodecanedimethanol (meth)acrylate, dimethylol dicyclopentanedi(meth)acrylate, ethylene oxide-modified hexahydrophthalic acid di(meth)acrylate, tricyclodecane dimethanol (meth)acrylate, neopentyl glycol-modified trimethylpropane di(meth)acrylate, adamantane di(meth)acrylate or 9,9-bis[4-(2-acryloyloxyethoxy)phenyl]fluorene; trifunctional acrylates such as trimethylolpropane tri(meth)acrylate, dipentaerythritol tri (meth)acrylate, propionic acid-modified dipentaerythritol tri (meth)acrylate, pentaerythritol tri(meth)acrylate, propylene oxide-modified trimethylolpropane tri(meth)acrylate, trifunctional urethane (meth)acrylate or tris(meth)acryloxyethyl isocyanurate; tetrafunctional acrylates such as diglycerin tetra(meth)acrylate or pentaerythritol tetra(meth) acrylate; pentafunctional acrylates such as dipentaerythritol penta(meth)acrylate; and hexafunctional acrylates such as dipentaerythritol hexa(meth)acrylate, caprolactone-modified dipentaerythritol hexa(meth)acrylate, or urethane (meth)acrylates (for example, reaction products of an isocyanate monomer and trimethylolpropane tri(meth)acrylate). These may be used alone or in combination of two or more. By selecting the crosslinking agent from among those described above, it is possible to adjust the crosslinking density of the adhesive layer and adjust the physical properties of the adhesive layer of the multi-region foldable adhesive film.

According to one embodiment of the present invention, the crosslinking agent may include one selected from among an isocyanate-based crosslinking agent, an epoxy-based crosslinking agent, and a mixture thereof. More specifically, the isocyanate-based crosslinking agent may be one selected from the group consisting of ethylene diisocyanate, 1,4-tetramethylene diisocyanate, 1,6-hexamethylene diisocyanate (HDI), 1,12-dodecane diisocyanate, cyclobutane-1,3-diisocyanate, cyclohexane-1,3-diisocyanate, cyclohexane-1,4-diisocyanate, 1-isocyanato-3,3,5-trimethyl-5-isocyanatomethyl-cyclohexane, 2,4-hexahydrotoluene diisocyanate, 2,6-hexahydrotoluene diisocyanate, hexahydro-1,3-phenylene diisocyanate, hexahydro-1,4-phenylene diisocyanate, perhydro-2,4'-diphenylmethane diisocyanate, perhydro-4,4'-diphenylmethane diisocyanate, 1,3-phenylene diisocyanate, 1,4-phenylene diisocyanate, 4,4'-stilbene diisocyanate, 3,3'-dimethyl-4,4'-biphenylene diisocyanate (TODI), toluene 2,4-diisocyanate, toluene 2,6-diisocyanate (TDI), diphenylmethane-2,4'-diisocyanate (MDI), 2,2'-diphenylmethane diisocyanate (MDI), diphenylmethane-4,4'-diisocyanate (MDI), isophorone diisocyanate (IPDI), and combinations thereof. In addition, the epoxy-based crosslinking agent may be one selected from the group consisting of ethylene glycol diglycidyl ether, triglycidyl ether, trimethylolpropane triglycidyl ether, N,N,N',N'-tetraglycidyl ethylenediamine, glycerin diglycidyl ether, and combinations thereof. By selecting the crosslinking agent from among those described above, it is possible to adjust the crosslinking density of the adhesive layer and adjust the physical properties of the adhesive layer of the multi-region foldable adhesive film.

According to one embodiment of the present invention, the isocyanate-based crosslinking agent may be a polyfunctional crosslinking agent. Specifically, the isocyanate-based crosslinking agent may be one, two or more selected from among aliphatic diisocyanate compounds such as 2,2-dimethylpentane diisocyanate, hexamethylene diisocyanate, 2,2,4-trimethylhexane diisocyanate, butene diisocyanate, 1,3-butadiene-1,4-diisocyanate, 2,4,4-trimethylhexamethylene diisocyanate, 1,6,11-undecane triisocyanate, 1,3,6-hexamethylene triisocyanate, 1,8-diisocyanate-4-isocyanatomethyloctane, bis(isocyanatoethyl)carbonate, and bis(isocyanatoethyl)ether; alicyclic isocyanate compounds such as isophorone diisocyanate, 1,2-bis(isocyanatomethyl)cyclohexane, 1,3-bis(isocyanatomethyl)cyclohexane, 1,4-bis(isocyanatomethyl)cyclohexane, dicyclohexylmethane diisocyanate, cyclohexane diisocyanate, methylcyclohexane diisocyanate, dicyclohexyldimethylmethane isocyanate, and 2,2-dimethyldicyclohexylmethane isocyanate; aromatic isocyanate compounds such as xylylene diisocyanate (XDI), bis(isocyanatoethyl)benzene, bis(isocyanatopropyl)benzene, bis(isocyanatobutyl)benzene, bis(isocyanatomethyl) naphthalene, bis(isocyanatomethyl)diphenyl ether, phenylene diisocyanate, ethylphenylene diisocyanate, isopropylphenylene diisocyanate, dimethylphenylene diisocyanate, diethylphenylene diisocyanate, diisopropylphenylene diisocyanate, trimethylbenzene triisocyanate, benzene triisocyanate, biphenyl diisocyanate, toluidine diisocyanate, 4,4-diphenylmethane diisocyanate, 3,3-dimethyldiphenyl methane-4,4-diisocyanate, bibenzyl-4,4-diisocyanate, bis(isocyanatophenyl)ethylene, 3,3-dimethoxybiphenyl-4,4-diisocyanate, hexahydrobenzene diisocyanate, and hexahydrodiphenylmethane-4,4-diisocyanate; sulfur-containing aliphatic isocyanate compounds such as bis(isocyanatoethyl)sulfide, bis(isocyanatopropyl)sulfide, bis(isocyanatohexyl)sulfide, bis(isocyanatomethyl)sulfone, bis(isocyanatomethyl)disulfide, bis(isocyanatopropyl)disulfide, bis(isocyanatomethylthio)methane, bis(isocyanatoethylthio)methane, bis(isocyanatoethylthio)ethane, bis(isocyanatomethylthio)ethane, and 1,5-diisocyanato-2-isocyanatomethyl-3-thiapentane; sulfur-containing aromatic isocyanate compounds such as diphenylsulfide-2,4-diisocyanate, diphenylsulfide-4,4-diisocyanate, 3,3-dimethoxy-4,4-diisocyanatodibenzylthioether, bis(4-isocyanatomethylbenzene)sulfide, 4,4-methoxybenzenethioethyleneglycol-3,3-diisocyanate, diphenyldisulfide-4,4-diisocyanate, 2,2-dimethyldiphenyldisulfide-5,5-diisocyanate, 3,3-dimethyldiphenyldisulfide-5,5-diisocyanate, 3,3-dimethyldiphenyldisulfide-6,6-diisocyanate, 4,4-dimethyldiphenyldisulfide-5,5-diisocyanate, 3,3-dimethoxy diphenyldisulfide-4,4-diisocyanate, and 4,4-dimethoxydiphenyldisulfide-3,3-diisocyanate; and sulfur-containing heterocyclic isocyanate compounds such as 2,5-diisocyanatothiophene, 2,5-bis(isocyanatomethyl)thiophene, 2,5-diisocyanatotetrahydrothiophene, 2,5-bis(isocyanatomethyl)tetrahydrothiophene, 3,4-bis(isocyanatomethyl)tetrahydrothiophene, 2,5-diisocyanato-1,4-dithiane, 2,5-bis(isocyanatomethyl)-1,4-dithiane, 4,5-diisocyanato-1,3-dithiolane, 4,5-bis(isocyanatomethyl)-1,3-dithiolane, and 4,5-bis(isocyanatomethyl)-2-methyl-1,3-dithiolane. In addition, one, two or more compounds having at least one isocyanate and/or isothiocyanate group may be used. In addition, it is also possible to use halogen-substitution products, such as chlorine-substitution products and bromine-substitution products of these isocyanate compounds, or alkyl-substitution products, alkoxy-substitution products, nitro-substitution products, prepolymer type modification products with polyhydric alcohol or thiol, carbodiimide-modified products, urea-modified products, biuret-modified products, or dimerization or trimerization products of these isocyanate compounds.

According to one embodiment of the present invention, the method includes a step of applying the adhesive composition onto a substrate. The method of applying the adhesive composition is not particularly limited. Specifically, the method of applying the adhesive composition onto a substrate may be an applicator coating method, a bar coater method, a comma coater method, or the like.

According to one embodiment of the present invention, the thickness of the adhesive layer may be 10 μm to 100 μm. Specifically, the thickness of the adhesive layer may be 10 μm to 80 μm, 10 μm to 60 μm, or 10 μm to 40 μm. By adjusting the thickness of the adhesive layer within the above-described range, it is possible to adjust the step coverage property and adhesive strength of the foldable adhesive film.

According to one embodiment of the present invention, the foldable adhesive film include a substrate provided on one surface of the adhesive layer. Specifically, by including the substrate, it is possible to ensure the basic physical properties of the multi-region foldable adhesive film and to protect the screen of a foldable display device to which the multi-region foldable adhesive film is applied.

According to one embodiment of the present invention, the substrate film may be a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film, or a polyimide film, but is not limited thereto.

According to one embodiment of the present invention, the thickness of the substrate may be 10 μm to 150 μm, 20 μm to 125 μm, or 20 μm to 100 μm. By adjusting the thickness of the substrate within the above-described range, it is possible for the foldable adhesive film to effectively relieve stress occurring during folding and it is possible to improve the recovery of the film.

According to one embodiment of the present invention, the multi-region foldable adhesive film may further include a release film. Specifically, the multi-region foldable adhesive film may be fabricated by sequentially laminating the substrate, the adhesive layer and the release film. Furthermore, the release film may include patterns corresponding to patterns formed by the regions having different crosslinking densities as described below.

According to one embodiment of the present invention, the method includes a step of providing an adhesive layer by curing the adhesive composition. Specifically, the method of curing the adhesive composition is not particularly limited. Specifically, the method of curing the adhesive composition may be thermal curing, photocuring by UV irradiation, or photocuring by E-beam irradiation. By selecting the above-described curing method, it is possible to form an adhesive layer which is included in the foldable adhesive film and to ensure physical properties required for the adhesive layer.

According to one embodiment of the present invention, the method includes a step of forming at least two regions having different crosslinking densities by crosslinking the adhesive layer.

According to one embodiment of the present invention, the adhesive layer may include at least two regions having different crosslinking densities. Specifically, the number of the regions having different crosslinking densities and included in the adhesive layer may be 3 to 50, 4 to 49, 5 to 48, 6 to 47, 7 to 45, 8 to 40, 9 to 35, 10 to 30, 11 to 25, or 12 to 20. Where the number of the regions having different crosslinking densities and included in the adhesive layer is adjusted within the above-described range, it is possible to effectively relieve stress occurring due to folding of the foldable adhesive film and to improve the recovery of the adhesive film.

According to one embodiment of the present invention, the regions having different crosslinking densities and different physical properties may be formed through UV irradiation. By performing UV irradiation as described above, it is possible to easily irradiate, with light, a region whose physical properties need to be adjusted, and it is possible to adjust the physical properties to be achieved by adjusting the wavelength and irradiation time of UV light.

According to one embodiment of the present invention, the glass transition temperature of the (meth)acrylate monomer containing at least one alkyl group may be −80° C. to −30° C. Specifically, the glass transition temperature of the (meth)acrylate monomer containing at least one alkyl group may be −75° C. to −35° C., −70° C. to −40° C., −68° C. to −45° C., or −65° C. to −50° C. Where the glass transition temperature of the (meth)acrylate monomer containing at least one alkyl group is adjusted within the above-described range, it is possible to improve the stress relief efficiency of the adhesive layer by adjusting the storage modulus thereof.

According to one embodiment of the present invention, the content of the (meth)acrylate monomer containing at least one alkyl group may be 90 wt % to 99.9 wt %. Specifically, the content of the (meth)acrylate monomer containing at least one alkyl group may be 95 wt % to 99.9 wt %, or 98 wt % to 99.9 wt %. Where the content of the (meth)acrylate monomer containing at least one alkyl group is adjusted within the above-described range, it is possible to satisfy the physical properties of the adhesive layer and to effectively relieve the stress caused by folding by adjusting the modulus of the cured product of the adhesive composition.

According to one embodiment of the present invention, the glass transition temperature of the (meth)acrylate monomer containing a polar group may be −40° C. to 150° C. Specifically, the glass transition temperature of the (meth) acrylate monomer containing a polar group may be 50° C. to 150° C., 60° C. to 140° C., 65° C. to 135° C., 70° C. to 130° C., 75° C. to 125° C., 80° C. to 120° C., 85° C. to 115° C., 90° C. to 110° C., or 95° C. to 105° C. Where the glass transition temperature of the (meth)acrylate monomer containing a polar group is adjusted within the above-described range, it is possible to improve the stress relief efficiency of the adhesive layer by adjusting the storage modulus thereof.

According to one embodiment of the present invention, the content of the (meth)acrylate monomer containing a polar group may be 0.1 wt % to 10.0 wt %. Specifically, the content of the (meth)acrylate monomer containing a polar group may be 0.1 wt % to 5.0 wt %, 0.1 wt % to 3.0 wt %, or 0.1 wt % to 2.0 wt %. Where the content of the (meth)acrylate monomer containing a polar group is adjusted within the above-described range, it is possible to adjust the modulus of the cured product of the adhesive composition.

According to one embodiment of the present invention, the content of the photoinitiator monomer may be 0.01 parts by weight to 5.00 parts by weight based on 100 parts by weight of the sum total of the (meth)acrylate monomer containing an alkyl group and the (meth)acrylate monomer containing a polar group. Specifically, the content of the photoinitiator monomer may be 0.01 parts by weight to 4.0 parts by weight, 0.01 parts by weight to 3.0 parts by weight, 0.01 parts by weight to 2.0 parts by weight, 0.01 parts by weight to 1.0 part by weight, 0.01 parts by weight to 0.5 parts by weight, or 0.01 parts by weight to 0.1 parts by weight, based on 100 parts by weight of the sum total of the (meth)acrylate monomer containing an alkyl group and the (meth)acrylate monomer containing a polar group. By adjusting the content of the photoinitiator monomer within the above-described range, it is possible to adjust the physical properties of regions of the multi-region foldable adhesive film, which need to have different physical properties.

According to one embodiment of the present invention, the regions having different crosslinking densities and different physical properties may be crosslinked by heating, UV light irradiation, or E-beam irradiation.

According to one embodiment of the present invention, the wavelength of UV light irradiation in the step of forming the regions having different crosslinking densities and different physical properties may be 200 nm to 400 nm. Specifically, the wavelength of UV light irradiation may be 210 nm to 390 nm, 220 nm to 380 nm, 230 nm to 370 nm, 240 nm to 360 nm, or 250 nm to 350 nm. Where the wavelength of UV light irradiation is adjusted within the above-described range, it is possible to adjust the crosslinking densities of the regions having different physical properties, thus adjusting the adhesive strength, elastic modulus, storage modulus, creep strain, recovery, viscosity, and glass transition temperature that are achieved in the foldable adhesive film.

According to one embodiment of the present invention, the dose of UV light irradiation in the step of forming the regions having different crosslinking densities and different physical properties may be 1,000 mJ to 5,000 mJ. Specifically, the dose of UV light irradiation in the step of forming the regions having different physical properties may be 1,500 mJ to 4,500 mJ, 2,000 mJ to 4,000 mJ, or 2,500 mJ to 3,500 mJ. Where the dose of UV light irradiation is adjusted within the above-described range, it is possible to adjust the adhesive strength, elastic modulus, storage modulus, creep strain, recovery, viscosity, and glass transition temperature that are achieved in the foldable adhesive film.

Hereinafter, the present invention will be described in detail with reference to examples. However, the examples according to the present invention may be modified into various different forms, and the scope of the present invention is not construed as being limited to the examples described below. The examples in the present specification are provided to more completely describe the present invention to those skilled in the art.

EXAMPLE 1

(1) Production of Copolymer

A monomer mixture including a mixture containing about 97.98 wt % of 2-ethylhexyl acrylate (2-EHA) and about 2.02 wt % of acrylic acid (AA), and based on 100 parts by weight of the mixture, 1.01 parts by weight of benzophenone methacrylate (BPMA), was introduced into a 1-L reactor, followed by introduction of ethyl acetate (EAc) as a solvent. Next, the reactor was purged with nitrogen gas for about 1 hour to remove oxygen, and then maintained at a temperature of 62° C. After the monomer mixture was homogenized, 400 ppm of azobisisobutyronitrile (AIBN) as a reaction initiator and 400 ppm of n-dodecylmercaptan (n-DDM) as a chain transfer agent were added thereto, and the monomer mixture was allowed to react. After completion of the reaction, the reaction product was diluted with ethyl acetate, thereby producing a copolymer having a weight-average molecular weight of 2,000,000.

(2) Preparation of Adhesive Composition

The epoxy-based crosslinking agent BXX-5240 or the isocyanate-based crosslinking agent BXX-5627 was added to 100 g of the produced copolymer, and the mixture was diluted in an ethyl acetate solution at a concentration of 18 wt %. The crosslinking agent was added in an amount of 0.3 equivalents. The resulting mixture was diluted with a solid content-adjusting solvent to have a suitable viscosity (500 cp to 1,500 cp) for coating, and then stirred using a mechanical stir for 15 minutes or more. Next, in order to remove bubbles generated during the mixing, the stirred mixture was sealed and then left to stand at room temperature for 1 hour.

(3) Fabrication of Adhesive Film

The adhesive composition was applied onto a release film by means of a comma coater to form a coating layer, and then dried at a temperature of 130° C. or below for 3 minutes, thereby fabricating an adhesive film having a thickness of 25 μm.

EXAMPLE 2

An adhesive film was fabricated in the same manner as in Example 1, except that a monomer mixture including a mixture containing about 98.48 wt % of 2-ethylhexyl acrylate (2-EHA) and about 2.02 wt % of acrylic acid (AA), and based on 100 parts by weight of the mixture, about 0.51 parts by weight of benzophenone methacrylate (BPMA), was introduced into a 1-L reactor.

EXAMPLE 3

An adhesive film was fabricated in the same manner as in Example 1, except that a monomer mixture including a mixture containing about 98.98 wt % of 2-ethylhexyl acrylate (2-EHA) and about 1.52 wt % of acrylic acid (AA), and based on 100 parts by weight of the mixture, about 0.51 parts by weight of benzophenone methacrylate (BPMA), was introduced into a 1-L reactor.

EXAMPLE 4

An adhesive film was fabricated in the same manner as in Example 1, except that a monomer mixture including a mixture containing about 98.50 wt % of 2-ethylhexyl acrylate (2-EHA) and about 1.50 wt % of acrylic acid (AA), and based on 100 parts by weight of the mixture, about 0.10 parts by weight of benzophenone methacrylate (BPMA), was introduced into a 1-L reactor.

EXAMPLE 5

An adhesive film was fabricated in the same manner as in Example 1, except that a monomer mixture including a mixture containing about 99.50 wt % of 2-ethylhexyl acrylate (2-EHA) and about 0.50 wt % of acrylic acid (AA), and based on 100 parts by weight of the mixture, about 0.1 parts by weight of benzophenone methacrylate (BPMA), was introduced into a 1-L reactor.

COMPARATIVE EXAMPLE 1

An adhesive film was fabricated in the same manner as in Example 1, except that a monomer mixture containing 98 wt % of 2-ethylhexyl acrylate (2-EHA) and 2 wt % of acrylic acid (AA) and not containing benzophenone methacrylate (BPMA) was introduced into a 1-L reactor.

COMPARATIVE EXAMPLE 2

An adhesive film was fabricated in the same manner as in Example 1, except that a monomer mixture containing, based on 100 parts by weight of the mixture, about 0.005 parts by weight of benzophenone methacrylate (BPMA), was introduced.

COMPARATIVE EXAMPLE 3

An adhesive film was fabricated in the same manner as in Example 1, except that a monomer mixture containing, based on 100 parts by weight of the mixture, about 6.00 parts by weight of benzophenone methacrylate (BPMA), was introduced.

EXPERIMENTAL EXAMPLE 1

Measurement of Gel Content

A certain amount (weight: $W_2$) of each of the adhesive films (fabricated in the Examples and the Comparative Examples) before and after UV light irradiation was placed in a basket-shaped 300-mesh SUS ($W_1$), and then immersed in THF and kept at 25° C. for 20 minutes. At this time, control was made so that the SUS mesh was not completely immersed in THF and only the adhesive layer was immersed in THF. After that, the SUS mesh was taken out of THF and sufficiently dried so that the THF was completely volatilized. Next, the sum of the weights of the SUS mesh and the undissolved swollen adhesive layer (weight of SUS mesh+ weight of undissolved swollen adhesive layer=$W_3$) was measured, and the gel content was calculated according to the following equation 1.

$$\text{Gel content (\%)}=(W_3-W_1)/W_2 \times 100 \qquad \text{[Equation 1]}$$

EXPERIMENTAL EXAMPLE 2

Measurement of Storage Modulus

Storage modulus was measured using an advanced rheometric expansion system G2 (TA Instruments). Each adhesive layer was folded several times and cut into a 1-mm-thick specimen, and then the storage modulus thereof was measured using a 8-mm-diameter parallel plate fixture under the conditions of frequency of 1 Hz, strain of 5% and heating rate of 10° C./min.

EXPERIMENTAL EXAMPLE 3

Measurement of Adhesive Strength

Each adhesive layer was cut to a size of 1 inch×1 inch, laminated onto a glass substrate, and then left to stand at room temperature for 1 day. Next, the adhesive strength thereof was measured at a peel rate of 300 mm/min using a TA texture analyzer.

TABLE 1

|  | Gel content (%) before UV light irradiation | Gel content (%) after UV light irradiation |
|---|---|---|
| Example 1 | 73 | 96 |
| Example 2 | 73 | 91 |
| Example 3 | 78 | 96 |
| Comparative Example 1 | 79 | — |

Referring to Table 1 above, it was confirmed that the crosslinking density (i.e., gel content) of each of the adhesive layers fabricated in Examples 1 to 3 increased after UV light irradiation compared to before UV light irradiation.

Accordingly, it was confirmed that, when the adhesive layer includes regions having different crosslinking densities, the regions have different degrees of curing. On the contrary, it was confirmed that, even when the adhesive layer of Comparative Example 1 was irradiated with UV light, regions having different crosslinking densities were not formed in the adhesive layer, and hence the multi-region foldable adhesive film could not be achieved. Furthermore, it was confirmed that, in the case of the adhesive layer of Comparative Example 2 to which an excessively small amount of benzophenone methacrylate (BPMA) was added, the crosslinking density of the adhesive layer did not change after UV light irradiation, indicating that regions having different crosslinking densities were not formed in the adhesive layer. In addition, it was confirmed that Comparative Example 3, to which an excessively large amount of benzophenone methacrylate (BPMA) was added, had decreased adhesive strength, indicating that it cannot be used as an adhesive layer.

FIG. 5 is a graph showing the storage moduli of the adhesive films of Examples 1 to 3 and Comparative Example 1 before and after UV light irradiation. As shown in FIG. 5, it was confirmed that, since regions having different crosslinking densities were not formed in the adhesive layer of Comparative Example 1, the storage modulus of the adhesive film did not change even when the adhesive film was irradiated with UV light. In contrast, it was confirmed that, in the case of Examples 1 to 3, regions having different crosslinking densities could be formed, and the crosslinking densities of the adhesive layers changed due to UV light irradiation, and hence the storage modulus thereof were also improved.

FIG. 6 is a graph showing the adhesive strengths of the adhesive film of Example 2 before and after UV light irradiation. Referring to FIG. 6, the results of measuring the adhesive strength in the direction of the long side of the bottled rectangle as shown in FIG. 6(*a*) are graphically shown in FIG. 6(*b*). Specifically, it was confirmed that, when the adhesive film was not irradiated with UV light, regions having different crosslinking densities were not included in the adhesive layer, and hence the peel strength of the adhesive film remained high throughout the entire region thereof. It was confirmed that, when the entire region of the adhesive film was irradiated with UV light, regions having different crosslinking densities were formed throughout the entire region of the adhesive layer, so that the peel strength of the adhesive film was decreased to a low level throughout the entire region thereof. Furthermore, it was confirmed that, when the adhesive film was irradiated with UV light at intervals of 1 cm or 2 cm, regions having different crosslinking densities were formed in the irradiated region at intervals of 1 cm or 2 cm, so that the adhesive strengths of the regions having different crosslinking densities were decreased.

EXPERIMENTAL EXAMPLE 4

Measurement of Creep Strain

For the adhesive films fabricated in Examples 4 and 5 and Comparative Example 1 above, the creep strain of the adhesive film of Comparative Example 1, which was not irradiated with UV light, was measured, and the creep strains of the adhesive film samples of Examples 4 and 5 before and after UV light irradiation were measured.

As shown in FIG. 9, the creep strain was a value obtained by applying a stress of 10,000 Pa to each adhesive film for 600 seconds, and then immediately measuring the strain of each adhesive film.

EXPERIMENTAL EXAMPLE 5

Measurement of Recovery

For the adhesive films fabricated in Examples 4 and 5 and Comparative Example 1 above, the recovery of the adhesive film of Comparative Example 1, which was not irradiated with UV light, was measured, and the recoveries of the adhesive films of Examples 4 and 5 before and after UV light irradiation were measured.

As shown in FIG. 9, the recovery was a value obtained by applying a stress of 10,000 Pa to each adhesive film for 600 seconds, then measuring the strain of each adhesive film 600 seconds after removal of the stress.

EXPERIMENTAL EXAMPLE 6

Dynamic Folding Test

FIG. 7 is a schematic view of a sample for a dynamic folding test. Specifically, samples, each having a size of 7.8×17 cm, were prepared by sequentially laminating a hard coating layer, a 50-μm-thick polyimide film, a hard coating layer, each of the adhesive layers fabricated in Examples 4 and 5 and Comparative Example 1, a polarizing plate, each of the adhesive layers fabricated in Examples 4 and 5 and Comparative Example 1, and a layer simulating a display panel.

FIG. 8 is a schematic view of a dynamic folding test. Referring to FIG. 8, after each sample was prepared, it was sandwiched between parallel plates having a spacing of 5 mm, and then subjected to a dynamic folding test in which it was folded and unfolded 200,000 times at 25° C. After completion of the test, each sample was collected and visually observed as to whether bubble generation, exfoliation, and hard coating layer cracking occurred. Evaluation was performed as follows. OK: there was no bubble generation, exfoliation, and hard coating layer cracking; and N.G.: bubble generation, exfoliation, or hard coating layer cracking occurred.

TABLE 2

| | UV light irradiation | Strain at −20° C. | | Strain at 60° C. | | Dynamic folding test | | Whether there is fold mark in folding portion after dynamic folding test | |
| | | Creep strain | Recovery | Creep strain | Recovery | Room temp. | 60° C. | Room temp. | 60° C. |
|---|---|---|---|---|---|---|---|---|---|
| Example 4 | X | 83 | 11 | 187 | 20 | OK | OK | Absent | Absent |
| | ○ | 70 | 6 | 48 | 3 | OK | OK | Absent | Absent |
| Example 5 | X | 121 | 20 | 588 | 116 | OK | OK | Absent | Absent |
| | ○ | 73 | 9 | 65 | 5 | OK | OK | Absent | Absent |

TABLE 2-continued

| | UV light | Strain at −20° C. | | Strain at 60° C. | | Dynamic folding test | | Whether there is fold mark in folding portion after dynamic folding test | |
| --- | --- | --- | --- | --- | --- | --- | --- | --- | --- |
| | irradiation | Creep strain | Recovery | Creep strain | Recovery | Room temp. | 60° C. | Room temp. | 60° C. |
| Comparative | X | 45 | 6 | 216 | 24 | NG | NG | Present | Present |
| Example 1 | ○ | 45 | 6 | 216 | 24 | NG | NG | Present | Present |

Referring to Table 2 above, it can be confirmed that the creep strains and recoveries of the adhesive films of Examples 4 and 5 changed as result of UV light irradiation. Specifically, it was confirmed that the creep strains and recoveries of the adhesive films of Examples 4 and 5 all decreased after UV light irradiation, and could be decreased after UV light irradiation compared to those of Comparative Example 1, suggesting that regions having different physical properties in a multi-region foldable adhesive film can be achieved through UV light irradiation. Furthermore, it was confirmed that, in the case of Examples 4 and 5 in which the physical properties were changed by irradiating the folding position with UV light in the dynamic folding test, even after each of the adhesive films was subjected to the dynamic folding test, there was no bubble generation, exfoliation and hard coating layer cracking, and no fold mark occurred in the folding portion (folding position).

In contrast, it was confirmed that, in the case of Comparative Example 1, the physical properties did not changed even after the adhesive film was irradiated with UV light, and since the creep strain and recovery of the folding portion were high, and thus bubble generation, exfoliation or hard coating layer cracking occurred in the sample and a fold mark occurred in the folding portion (folding position), when the dynamic folding test was performed.

Therefore, according to the multi-region foldable adhesive film of the present invention and the fabrication method therefor, the physical properties at the folding position of the foldable adhesive film are changed to differ from those at the unfolding position, whereby it is possible to improve the recovery and stress relief efficiency of the foldable adhesive film and prevent the occurrence of a folding mark in the folding portion of the foldable adhesive film.

Although the present invention has been described above with reference to the limited embodiment, the present invention is not limited thereto, and various modifications and alterations may be made by those skilled in the art without departing from the technical spirit of the present invention and equivalents to the appended claims.

DESCRIPTION OF REFERENCE NUMERALS

10: Adhesive film
100: Multi-region foldable adhesive film
110: Substrate
130: Adhesive layer
131: First region
133: Second region
135: Third region
150: Release film

The invention claimed is:

1. A multi-region foldable adhesive film comprising:
an adhesive layer comprising at least two regions having different crosslinking densities;

and
a substrate provided on one surface of the adhesive layer,
wherein the adhesive layer comprises a cured product of an adhesive composition comprising: a polymer of a monomer mixture comprising a (meth)acrylate monomer containing at least one alkyl group having 2 to 8 carbon atoms, a (meth)acrylate monomer containing a polar group, and a photoinitiator monomer; and a crosslinking agent, and
wherein the photoinitiator monomer is a benzophenone derivative,
wherein a content of the photoinitiator monomer is 0.01 parts by weight to 1.0 parts by weight based on 100 parts by weight of the sum total of the (meth)acrylate monomer containing the at least one alkyl group and the (meth)acrylate monomer containing the polar group,
wherein the at least two regions having different crosslinking densities are provided inside the adhesive layer so as not to be exposed to a surface of the adhesive layer,
wherein the regions being formed at positions spaced apart from the substrate and from a release film in the adhesive layer
wherein the regions having different crosslinking densities are formed through UV light irradiation having a wavelength of 200 nm to 400 nm and a dose of 1,000 mJ to 5,000 mJ,
wherein a difference in physical property between the at least two regions having different crosslinking densities is 10% or more,
and the physical property is one selected from the group consisting of elastic modulus at 80° C., elongation at 20° C., creep strain at 20° C., recovery at 20° C., hardness at 20° C., viscosity at 50° C., and combinations thereof.

2. The multi-region foldable adhesive film of claim 1, wherein the at least two regions having different crosslinking densities are provided in a direction parallel to a folding axis of the multi-region foldable adhesive film.

3. The multi-region foldable adhesive film of claim 1, wherein the at least two regions having different crosslinking densities are provided in a direction forming an angle with respect to a folding axis of the multi-region foldable adhesive film.

4. The multi-region foldable adhesive film of claim 1, further comprising a release film provided on a surface opposite to the one surface of the adhesive layer on which the substrate is provided.

5. The multi-region foldable adhesive film of claim 4, wherein the release film comprises patterns corresponding to patterns formed by the at least two regions having different crosslinking densities.

6. The multi-region foldable adhesive film of claim 1, wherein the (meth)acrylate monomer containing the at least one alkyl group has a glass transition temperature of −80° C. to −30° C.

7. The multi-region foldable adhesive film of claim 1, wherein the (meth)acrylate monomer containing the polar group has a glass transition temperature of −40° C. to 150° C.

8. The multi-region foldable adhesive film of claim 1, wherein a content of the (meth)acrylate monomer containing the at least one alkyl group in the monomer mixture is 90.0 wt % to 99.9 wt %.

9. The multi-region foldable adhesive film of claim 1, wherein a content of the (meth)acrylate monomer containing the polar group in the monomer mixture is 0.1 wt % to 10.0 wt %.

\* \* \* \* \*